United States Patent [19]
Kamatani

[11] Patent Number: 5,361,269
[45] Date of Patent: Nov. 1, 1994

[54] NON-MECHANICAL LASER BEAM SCANNING DEVICE EMPLOYING A DIFFRACTION GRATING AND AN ACOUSTO-OPTIC DEFLECTOR FOR OPTICAL RECORDING AND READOUT

[76] Inventor: Yasuo Kamatani, 2-12-2 Yokoyama, Sagamihara-shi, Kanagawa 229, Japan

[21] Appl. No.: 82,493

[22] Filed: Jun. 28, 1993

[51] Int. Cl.⁵ .................... H01S 3/101; H01S 3/106; G02B 26/10; G02F 1/335
[52] U.S. Cl. ..................................... 372/24; 359/202; 385/7
[58] Field of Search .................. 372/24; 385/37, 7; 359/202, 305

[56] References Cited
U.S. PATENT DOCUMENTS

| | | | |
|---|---|---|---|
| 4,425,023 | 1/1984 | Matsumoto et al. | 385/14 |
| 4,762,383 | 8/1988 | Yamashita et al. | 385/7 |
| 4,918,679 | 4/1990 | Opheiji et al. | 369/44.37 |
| 5,191,466 | 3/1993 | Gross et al. | 359/305 |

*Primary Examiner*—Rodney B. Bovernick
*Assistant Examiner*—Robert McNutt
*Attorney, Agent, or Firm*—John M. Brandt

[57] ABSTRACT

Apparatus and method of non-mechanical scanning a laser diode light beam by altering the wavelength of the beam through changes in current applied to the diode and applying the beam to a diffraction grating to change the position of the beam as it emerges from the grating. A second dimension is scanned by the employment of an acousto-optic deflector and electronic driving and control means to change the position of the beam as it emerges from the deflector.

3 Claims, 3 Drawing Sheets

NON-MECHANICAL LASER BEAM SCANNING DEVICE EMPLOYING A DIFFRACTION GRATING AND AN ACOUSTO-OPTIC DEFLECTOR FOR OPTICAL RECORDING AND READOUT

BACKGROUND OF THE INVENTION

1. Field of the Invention

The invention resides in the field of optical recording and readout apparatus and more particularly relates to a scanning device employing a semiconductor laser, a diffraction grating, and control means for altering the frequency of the laser to effect the position of the laser beam.

2. Description of the Prior Art

Semiconductor or diode lasers are well known devices employed in information transfer optical devices such as laser printers for computers and compact discs for audio or visual entertainment systems. They offer advantages of small size, low power dissipation, low cost, low noise and long life.

The beam or light spot produced by these lasers must, in order to produce a flow of information, move with respect to the information carrier. In the case of compact or magneto-optical discs, the disc rotates presenting a succession of digitally coded information bits to be read by a reflection pick up system. The laser moves as well to access different portions of the disc along its radius.

Such motion requires motors which need power, introduce mechanical complexity, and generate noise, a highly undesirable trait in the field of audio reproduction. One device that has been suggested to non-mechanically scan the laser beam is an acousto-optic deflector (AOD). These units employ a diffractiion crystal which is modulated by an acoustic wave to produce a modification in the deflectiion of an incident beam as it passes through the crystal. The angle of deflection is proportional to the frequency of the acoustic wave and this effect has been proposed as a means for moving a laser beam in an optical recording device.

U.S. Pat. No. 5,157,650, Ozue et al discloses specific apparatus in which a saw tooth wave is applied to such a modulator for scanning a plurality of laser beams across a moving tape.

The present invention presents an alternative non-mechanical approach to beam scanning which may be combined with the AOD to provide a complete two dimensional electronic scanning format involving no mechanical transport whatsoever.

This is accomplished by taking advantage of the characteristics of laser diodes known as frequency changing. As the operating temperature which is power dependent increases, the output wave length of laser diodes similarly increases. These wavelength increases come in discrete steps as a consequence of the materials of which the diode laser is composed and the fundamental manner in which it operates. See for example: Extension of the Current Continuous Frequency Tuning Range of Ga Al As Laser Diodes by the External Cavity, Shutong el al, SPIE vol. 740; Laser Diode Optics 1987, page 8–11; and Diode Lasers Their Characteristics and Control, Kimball el al, as above pages 41–46.

The present invention proposes to combine this attribute of wavelength variation with power input with the use of a diffraction grating to alter the position of the laser beam emerging from interaction with the grating (transmission or reflection). This technique may be used with a moving substrate on which information is to be recorded or is already encoded or with an AOD to read both dimensions of the carrier.

SUMMARY OF THE INVENTION

The invention may be summarized as apparatus and a method of non-mechanically scanning a laser diode light beam by altering the wavelength or frequency of the beam through changes in current applied to the diode and applying the beam to a diffraction grating, either transmission or reflection, to change the position of the beam as it emerges from the grating.

This may be combined with, for example, an acousto-optic deflector to scan the beam in a second dimension to record or read information on the entire surface of a substrate. The substrate is preferably non-moving but of course the technique may be applied to a moving substrate as well.

The invention provides a means for greatly reducing the size of devices for reading information. For example it is intended that a combination of laser diode, electronics control chip and grating may be constructed as a unit utilizing known semi conductor and printed circuit etching and manufacturing techniques.

When used in combination with an additional scanning mechanism such as the AOD mentioned above, the resulting device can record or read information in two dimension and yet be quite small compared to currently employed technology.

Additionally, such a device would not be limited to a single non-moving substrate but could be used in combination with a serially advanced carrier in which information was read in blocks eliminating continuous mechanical noise but retaining the advantage of compactness inherent in a coiled tape or disc.

These and other features and advantages of the invention will be more apparent from the description of the preferred embodiment taken in conjunction with the drawing which follows:

DESCRIPTION OF THE PREFERRED EMBODIMENT

Figure 1:
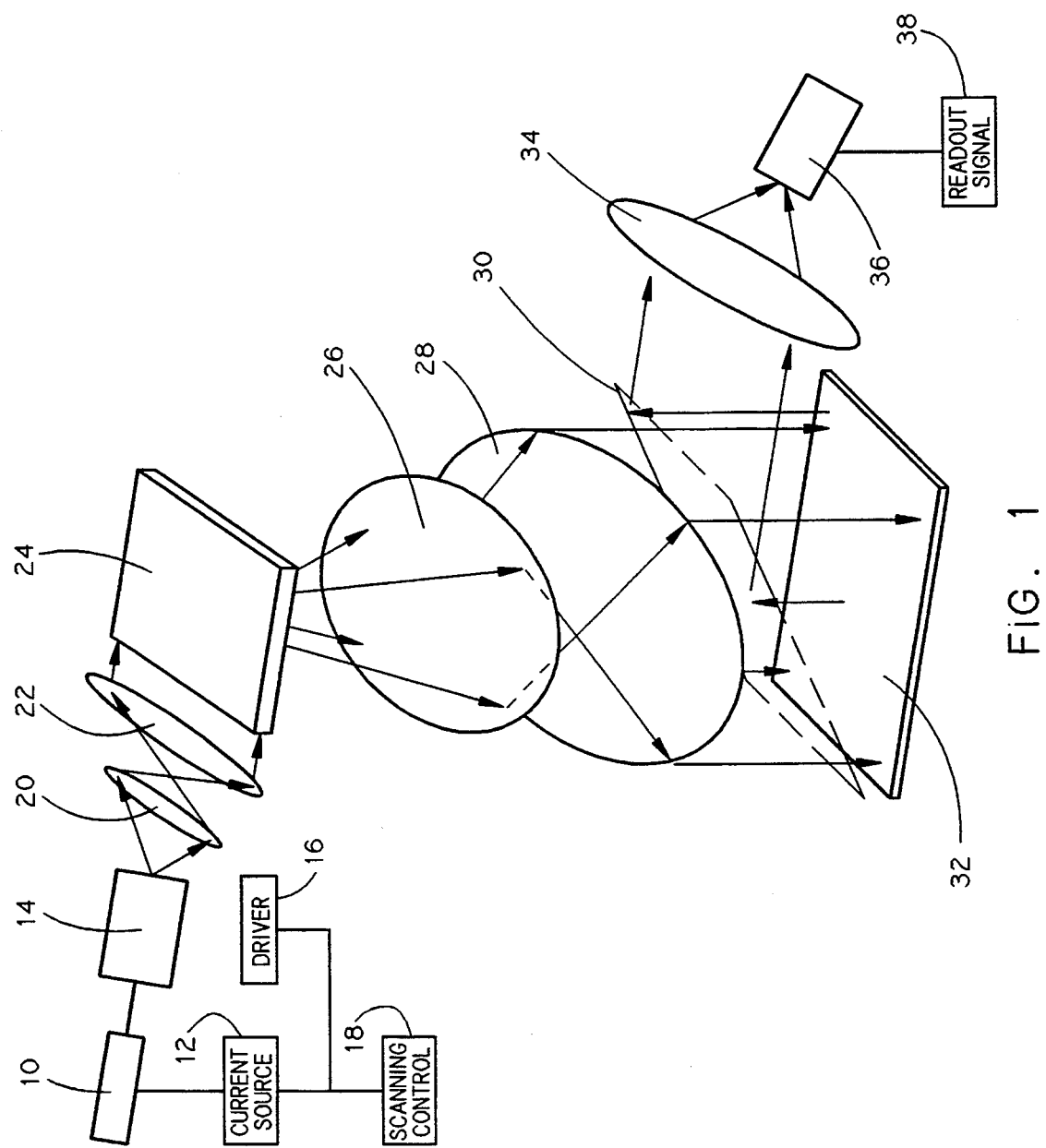
FIG. 1 is a schematic drawing in perspective of the preferred embodiment of the invention.

Referring to FIG. 1 there is shown a schematic drawing of the preferred embodiment in which semiconductor laser 10 energized by current source 12 emits a laser beam which is received and transmitted by asoustoptic deflector 14 operated by driver 16. The beam emanating from deflector 14 is scanned in a first direction, the x axis for example, by varying the current applied to laser 10 by source 12 by programmable scan control 18.

As discussed above, this current change will shift the wavelength in a selected manner in response to the program generated by scan control 18 preferably a linear saw tooth format. Lenses 20 and 22 position the beam on grating 24 either a reflection or transmission grating.

The beam emanating from the grating will experience a shift in angular position as the wavelength of the laser beam changes in accordance with the well known principles of operation of diffraction gratings.

Lenses 26 and 28 further direct the beam through semi silvered mirror 30 to information containing substrate 32, a relective medium digitally encoded with opaque segments for example. Mirror 30 redirects the reflected beam through lens 34 to photodetector 36 which is interrogated by readout device 38.

In addition to the scanning achieved by current change to the laser, acoustopic deflector 14 will scan the beam in a second, preferably orthogonal direction, the Y axis for example. By varying the frequency output of driver 16 in a selected manner again by scan control 18, the angle of deflection of the emerging beam is continuously altered to provide complete coverage of substrate 30.

Figure 2:
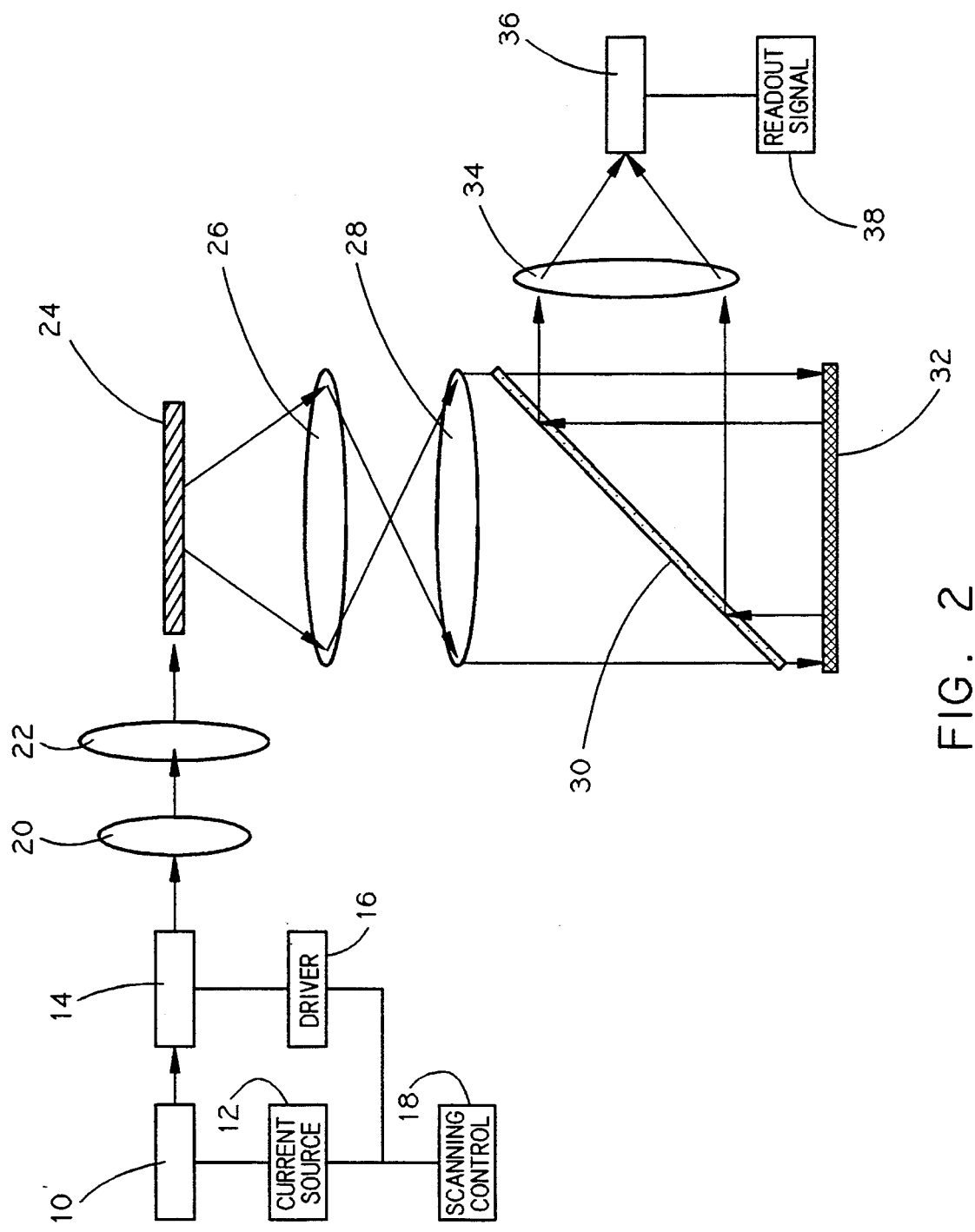
FIG. 2 is a side view of the embodiment of FIG. 1.
Figure 3:
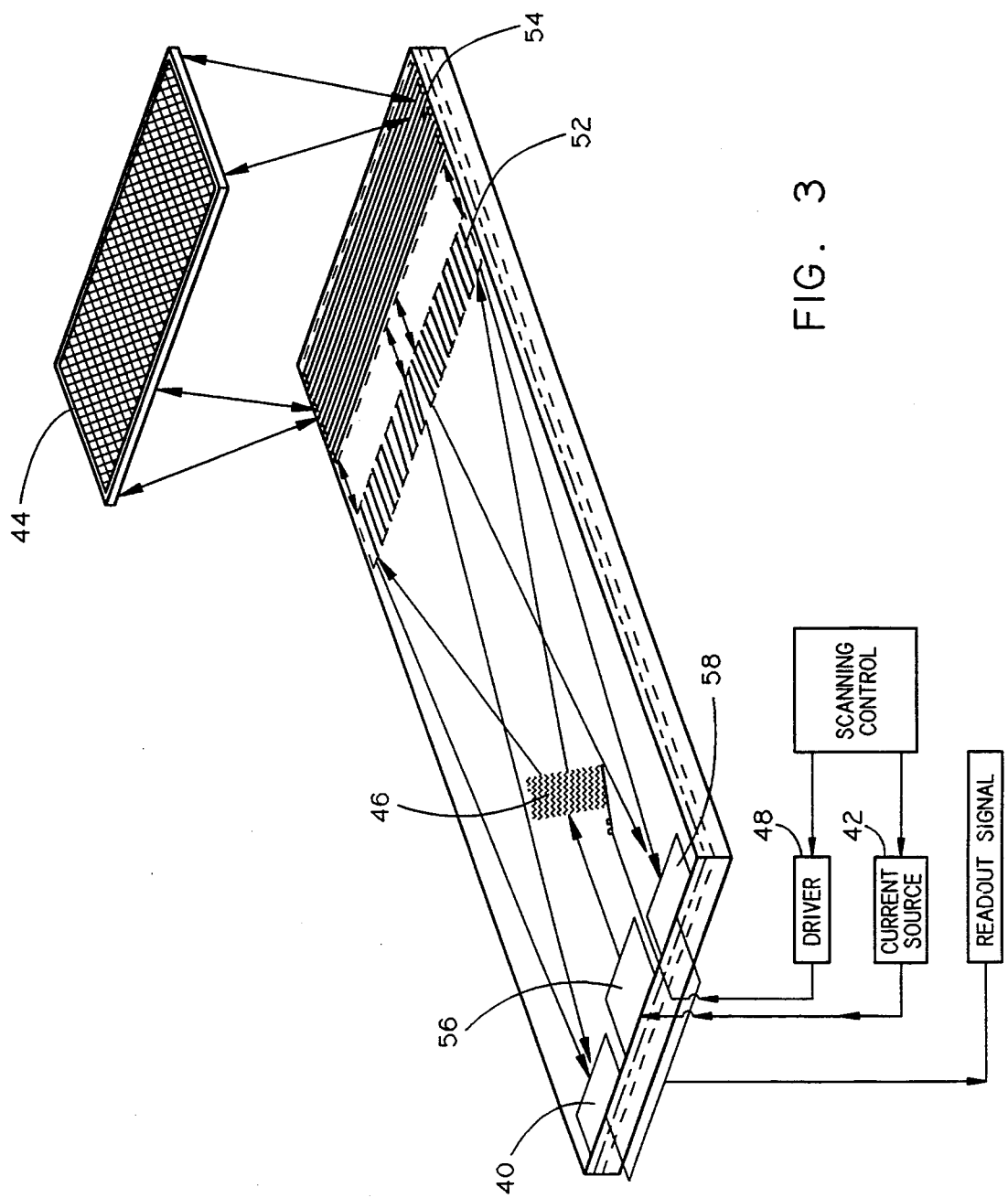
FIG. 3 is a perspective view of the invention in the form of an integrated electro optical substrate.

FIG. 2 is a side view of the embodiment of FIG. 1 wherein like numbers refer to like parts for purposes of clarification. FIG. 3 is a perspective view of the invention wherein electrical and mechanical components are combined in a single unit utilizing integrated electro-optical fabricating techniques.

As shown laser diode 40 energized by current source 42 emits a laser beam which is collimated to produce a beam-spot diameter required to focus on a pit in substrate 44. The laser beam is received and transmitted by AOD 46 operated by driver 48. An acoustic wave is emitted by integrated electrode 50. The acoustic wave travels along the thin film waveguide path.

The laser beam emanating from AOD 46 is scanned in a first direction. A grating beam splitter 52 is functionally the same as a lens to direct the beam. Grating 54 changes the direction of laser beam according to its wavelength. Grating 54 thereby provides scanning in a second direction.

The reflected laser beam from substrate 44 is divided two ways by grating beam splitter 52 and then is detected by dual photodetectors 56 and 58.

Variations in the above described laser beam scanning apparatus will now be apparent to those skilled in the art. For example, the substrate may be a continuous tape scanned diagonally by laser wavelength alteration alone or may be moved in discrete steps and each portion scanned by the combination disclosed above.

Additionally, the laser beam may be modulated as well as scanned to provide a method of recording on a blank sensitized substrate. In this application the laser output is altered in intensity, digitally for example, to provide an information containing signal which can be transferred to a recording medium through the scanning process.

Further modification may become obvious from the above disclosure. Accordingly, the scope of the invention is defined by the following claims.

What is claimed is:

1. An optical apparatus for scanning a semiconductor laser beam comprising in combination
   a semiconductor laser beam source which generates and emits a laser beam;
   a diffraction grating positioned to intercept said beam;
   electronic control means for varying the power applied to said laser beam source in a selected manner for altering the wavelength of said beam produced by said laser whereby the angular position of the beam emanating from said grating is varied by said electronic control means;
   acoustoptic deflecting means disposed in the path of said laser beam between said laser and said grating;
   electronic driving means operatively connected to said deflecting means to form a frequency dependent diffraction grating; and
   second electronic control means operatively connected to said driving means to alter said frequency in a selected manner to vary the angular position of the beam emanating from said deflecting means by said second electronic control means.

2. The apparatus of claim 1 wherein said grating comprises a reflection grating and said beam emanating from said grating is a reflected beam.

3. The apparatus of claim 1 wherein said grating comprises a transmission grating.

* * * * *